US009947530B2

(12) United States Patent
Tak et al.

(10) Patent No.: US 9,947,530 B2
(45) Date of Patent: Apr. 17, 2018

(54) METHOD OF MANUFACTURING NITRIDE SEMICONDUCTOR SUBSTRATE

(71) Applicant: Samsung Electronics Co., Ltd., Suwon-si (KR)

(72) Inventors: Young Jo Tak, Hwaseong-si (KR); Sam Mook Kang, Hwaseong-si (KR); Mi Hyun Kim, Seoul (KR); Jun Youn Kim, Hwaseong-si (KR); Young Soo Park, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/399,898

(22) Filed: Jan. 6, 2017

(65) Prior Publication Data

US 2017/0358443 A1 Dec. 14, 2017

(30) Foreign Application Priority Data

Jun. 14, 2016 (KR) ........................ 10-2016-0073871

(51) Int. Cl.
*H01L 21/20* (2006.01)
*H01L 21/205* (2006.01)
(Continued)

(52) U.S. Cl.
CPC ...... *H01L 21/0254* (2013.01); *H01L 21/0251* (2013.01); *H01L 21/0262* (2013.01);
(Continued)

(58) Field of Classification Search
CPC ........... H01L 21/02381; H01L 21/0254; H01L 21/02458; H01L 21/02502;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 0461505 B1 12/2004
KR 0813561 B1 3/2008
(Continued)

OTHER PUBLICATIONS

"Silicon nitride." Wikipedia, The Free Encyclopedia. Wikipedia, The Free Encyclopedia, Apr. 22, 2016.*

*Primary Examiner* — Robert Bachner
*Assistant Examiner* — Molly Reida
(74) *Attorney, Agent, or Firm* — Muir Patent Law, PLLC

(57) ABSTRACT

A method of manufacturing a nitride semiconductor substrate includes providing a silicon substrate having a first surface and a second surface opposing each other, growing a nitride template on the first surface of the silicon substrate in a first growth chamber, in which a silicon compound layer is formed on the second surface of the silicon substrate in a growth process of the nitride template, removing the silicon compound layer from the second surface of the silicon substrate, growing a group III nitride single crystal on the nitride template in a second growth chamber, and removing the silicon substrate from the second growth chamber.

20 Claims, 9 Drawing Sheets

(51) Int. Cl.

| | |
|---|---|
| ***H01L 21/304*** | (2006.01) |
| ***H01L 21/3065*** | (2006.01) |
| ***H01L 21/02*** | (2006.01) |
| ***H01L 21/306*** | (2006.01) |

(52) U.S. Cl.

CPC .. *H01L 21/02381* (2013.01); *H01L 21/02389* (2013.01); *H01L 21/02458* (2013.01); *H01L 21/02502* (2013.01); *H01L 21/02507* (2013.01); *H01L 21/02513* (2013.01); *H01L 21/02631* (2013.01); *H01L 21/02642* (2013.01); *H01L 21/304* (2013.01); *H01L 21/30604* (2013.01)

(58) Field of Classification Search

CPC ......... H01L 21/02505; H01L 21/02507; H01L 21/00251; H01L 21/02513

See application file for complete search history.

(56) References Cited

U.S. PATENT DOCUMENTS

| | | | | |
|---|---|---|---|---|
| 6,652,648 | B2 | 11/2003 | Park | |
| RE38,466 | E | 3/2004 | Inoue et al. | |
| 6,818,465 | B2 | 11/2004 | Biwa et al. | |
| 6,818,530 | B2 | 11/2004 | Shimoda et al. | |
| 6,858,081 | B2 | 2/2005 | Biwa et al. | |
| 6,967,353 | B2 | 11/2005 | Suzuki et al. | |
| 7,002,182 | B2 | 2/2006 | Okuyama et al. | |
| 7,084,420 | B2 | 8/2006 | Kim et al. | |
| 7,087,932 | B2 | 8/2006 | Okuyama et al. | |
| 7,154,124 | B2 | 12/2006 | Han et al. | |
| 7,208,725 | B2 | 4/2007 | Sherrer et al. | |
| 7,288,758 | B2 | 10/2007 | Sherrer et al. | |
| 7,319,044 | B2 | 1/2008 | Han et al. | |
| 7,501,656 | B2 | 3/2009 | Han et al. | |
| 7,709,857 | B2 | 5/2010 | Kim et al. | |
| 7,759,140 | B2 | 7/2010 | Lee et al. | |
| 7,781,727 | B2 | 8/2010 | Sherrer et al. | |
| 7,790,482 | B2 | 9/2010 | Han et al. | |
| 7,915,150 | B2 | 3/2011 | Park et al. | |
| 7,940,350 | B2 | 5/2011 | Jeong | |
| 7,959,312 | B2 | 6/2011 | Yoo et al. | |
| 7,964,881 | B2 | 6/2011 | Choi et al. | |
| 7,985,976 | B2 | 7/2011 | Choi et al. | |
| 7,994,525 | B2 | 8/2011 | Lee et al. | |
| 8,008,683 | B2 | 8/2011 | Choi et al. | |
| 8,013,352 | B2 | 9/2011 | Lee et al. | |
| 8,039,869 | B2 | 10/2011 | Lester et al. | |
| 8,049,161 | B2 | 11/2011 | Sherrer et al. | |
| 8,129,711 | B2 | 3/2012 | Kang et al. | |
| 8,179,938 | B2 | 5/2012 | Kim | |
| 8,263,987 | B2 | 9/2012 | Choi et al. | |
| 8,324,646 | B2 | 12/2012 | Lee et al. | |
| 8,399,944 | B2 | 3/2013 | Kwak et al. | |
| 8,432,511 | B2 | 4/2013 | Jeong | |
| 8,459,832 | B2 | 6/2013 | Kim | |
| 8,502,242 | B2 | 8/2013 | Kim | |
| 8,536,604 | B2 | 9/2013 | Kwak et al. | |
| 8,735,931 | B2 | 5/2014 | Han et al. | |
| 8,766,295 | B2 | 7/2014 | Kim | |
| 8,969,178 | B2 | 3/2015 | Lee et al. | |
| 9,053,931 | B2 | 6/2015 | Yoshida et al. | |
| 9,153,450 | B2 | 10/2015 | Kim et al. | |
| 9,209,018 | B2 | 12/2015 | Beaumont et al. | |
| 2002/0048964 | A1* | 4/2002 | Yuasa .................... | B82Y 20/00 438/763 |
| 2004/0107891 | A1 | 6/2004 | Nagai et al. | |
| 2009/0267188 | A1* | 10/2009 | Piner ................. | H01L 29/66462 257/613 |
| 2012/0161149 | A1* | 6/2012 | Wuu ................. | H01L 21/02002 257/76 |
| 2013/0175541 | A1* | 7/2013 | Park .................. | H01L 21/02439 257/76 |
| 2014/0073115 | A1* | 3/2014 | Lee ................... | H01L 21/02263 438/478 |

FOREIGN PATENT DOCUMENTS

| | | | | |
|---|---|---|---|---|
| KR | 1137905 B1 | | 5/2012 | |
| KR | 1178504 B1 | | 9/2012 | |
| KR | 2013-0081956 | | 7/2013 | |
| WO | WO 2015067681 A1 | * | 5/2015 | ....... H01L 21/02381 |

* cited by examiner

METHOD OF MANUFACTURING NITRIDE SEMICONDUCTOR SUBSTRATE

CROSS-REFERENCE TO RELATED APPLICATION

This application claims benefit of priority under 35 USC § 119 to Korean Patent Application No. 10-2016-0073871 filed on Jun. 14, 2016 in the Korean Intellectual Property Office, the disclosure of which is incorporated herein by reference in its entirety.

BACKGROUND

1. Field

The present disclosure relates to a method of manufacturing a nitride semiconductor substrate.

2. Description of Related Art

Hybrid substrates, such as sapphire or silicon carbide (SiC), have been used commonly as substrates to allow nitride single crystals to be grown therein. However, the prices of hybrid substrates are relatively high or hybrid substrates are difficult to fabricate, due to high hardness thereof. Therefore, demand for nitride semiconductor substrates, such as gallium nitride (GaN), has increased.

Conventional nitride semiconductor substrates may be manufactured in such a manner that nitride single crystals, such as GaN, are grown on a sapphire substrate, and the sapphire substrate is removed. However, in a case in which the sapphire substrate is used, large size substrates (e.g., 6 inches or greater) may be difficult to manufacture.

In order to address the problem, a method of applying a silicon substrate to the growth of a nitride semiconductor may be used. However, when a nitride single crystal thin film is grown in a silicon substrate, a lattice parameter mismatch between the silicon substrate and the nitride thin film may increase dislocation density. In addition, a difference in thermal expansion coefficients may generate cracks caused by plastic deformation. In a case in which the quality of nitride single crystals is considered, there may be a problem in which it is difficult to grow nitride single crystals in a more rapid manner.

SUMMARY

Example embodiments provide a method of manufacturing a high quality nitride semiconductor substrate.

According to an example embodiment, a method of manufacturing a nitride semiconductor substrate may include providing a silicon substrate having a first surface and a second surface opposing each other, growing a nitride template on the first surface of the silicon substrate in a first growth chamber, in which a silicon compound layer is formed on the second surface of the silicon substrate in a growth process of the nitride template, removing the silicon compound layer from the second surface of the silicon substrate, growing a group III nitride single crystal on the nitride template in a second growth chamber, and removing the silicon substrate from the second growth chamber.

According to an example embodiment, a method of manufacturing a nitride semiconductor substrate may include providing a silicon substrate having a first surface and a second surface opposing each other, growing a nitride template having an Al-containing nitride layer on the first surface of the silicon substrate in a first growth chamber, removing a portion of the silicon substrate from the second surface of the silicon substrate after the nitride plate is grown, growing a group III nitride single crystal on the nitride template in a second growth chamber, and removing the second surface of the silicon substrate to the Al-containing nitride layer using an etching process in the second growth chamber.

According to an example embodiment, a method of manufacturing a nitride semiconductor substrate may include providing a silicon substrate having a first surface and a second surface, opposing each other; growing a nitride template on the first surface of the silicon substrate under a first process environment, in which a silicon compound layer is formed on the second surface of the silicon substrate during the growth of the nitride template; removing the silicon compound layer from the second surface of the silicon substrate; growing a group III nitride single crystal on the nitride template under a second process environment different from the first process environment; and removing the silicon substrate by applying an etching process to the second surface of the silicon substrate.

BRIEF DESCRIPTION OF DRAWINGS

The above and other aspects, features and other advantages of an example embodiment will be more clearly understood from the following detailed description when taken in conjunction with the accompanying drawings, in which:

FIG. 7 is an enlarged cross-sectional view of portion "A" (a susceptor) employed in the HVPE device illustrated in FIG. 6, while

DETAILED DESCRIPTION

Figure 1:
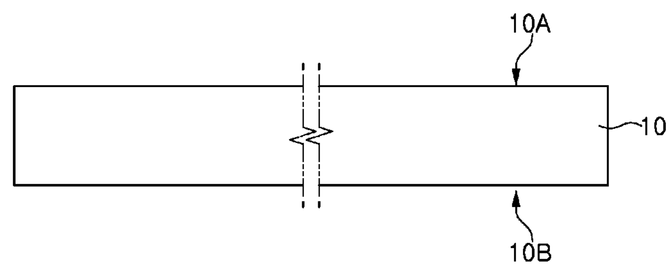
FIGS. 1 to 5 are process cross-sectional views illustrating a method of manufacturing a nitride semiconductor substrate according to an example embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

FIGS. 1 to 5 are process cross-sectional views illustrating a method of manufacturing a nitride semiconductor substrate according to an example embodiment.

As illustrated in FIG. 1, a silicon substrate 10 having a first surface 10A and a second surface 10B, opposing each other, may be provided.

The silicon substrate 10 employed in the example embodiment may include not only a substrate including only a silicone material, but also a substrate partially containing the silicone material. For example, as the silicon substrate 10, a silicon on insulator (SOI) substrate may be used. An insulator may be used as an etch stop layer in a case in which a silicon substrate is removed from a second growth chamber. The first surface 10A of the silicon substrate 10 may be used as a plane for crystal growth, and may also be provided as a Si (111) plane.

Figure 2:
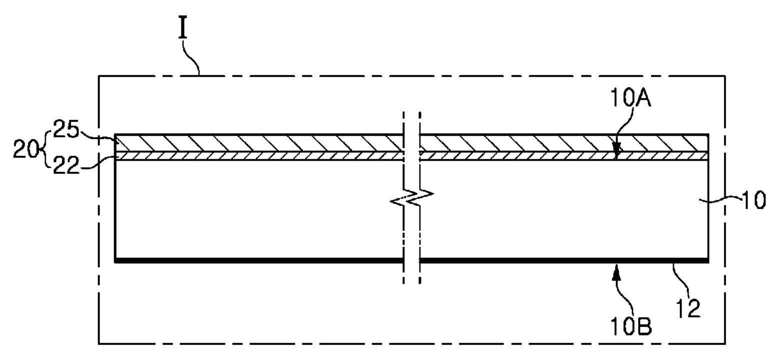

As illustrated in FIG. 2, a nitride template 20 may be grown on the first surface 10A of the silicon substrate 10 using a first process environment. For example, the first process environment may include a first growth chamber I and the nitride template 20 may be grown on the first surface 10A of the silicon substrate 10 in the first growth chamber I.

The first growth chamber I may be provided as a chamber for growth of a nitride single crystal using a process other than an HVPE process. The first growth chamber I may also be provided as a chamber in which a process is performed that may not guarantee faster crystal growth than can be achieved by using the HVPE process (which is generally slower than the HVPE process), but may guarantee growth of a high quality crystal. For example, the first growth chamber I may be provided as a chamber for metal-organic chemical vapor deposition (MOCVD) growth, molecular beam epitaxy (MBE) growth, or sputtering growth.

The nitride template 20 may include an aluminum (Al)-containing nitride layer 22. The nitride template 20 employed in the example embodiment may include the Al-containing nitride layer 22 and a gallium nitride (GaN) stress relaxation layer 25. In some example embodiments, the Al-containing nitride layer 22 may be formed on the first surface 10A and the gallium nitride (GaN) stress relaxation layer 25 may be formed on the Al-containing nitride layer 22, but the disclosure is not limited thereto.

The Al-containing nitride layer 22 may be provided as a buffer layer for lattice matching. In addition, the Al-containing nitride layer 22 may include aluminum nitride (AlN)/aluminum gallium nitride (AlGaN), and may allow AlN/AlGaN to be stacked twice or more, according to need. The Al-containing nitride layer 22 may be used as the etch stop layer in an etching process of removing the silicon substrate 10. The GaN stress relaxation layer 25 may include an undoped GaN layer. According to need, the GaN stress relaxation layer 25 may further include other stress relaxation elements besides the undoped GaN layer. The Al-containing nitride layer 22 and the GaN stress relaxation layer 25 may have various structures (see FIGS. 18 and 19).

In a growth process of the nitride template 20, a silicon compound layer 12 may be formed on the second surface 10B of the silicon substrate 10. The silicon compound layer 12 may be provided as silicon nitride ($SiN_x$) or silicon oxynitride ($SiO_xN_y$). In detail, in a process of forming the nitride template 20 using a high-temperature MOCVD process, a nitrogen source gas, such as ammonia ($NH_3$), may react with the silicon substrate 10, so that a silicon oxynitride layer may be formed on a surface of the silicon substrate 10. In FIG. 2, the silicon compound layer 12 is illustrated as being disposed only on the second surface 10B of the silicon substrate 10, but may also be formed on a side surface of the silicon substrate 10.

Figure 3:
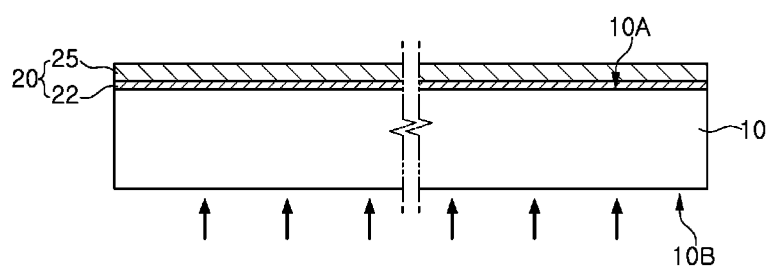

Subsequently, as illustrated in FIG. 3, the silicon compound layer 12 disposed on the second surface 10B of the silicon substrate 10 may be removed.

A process described above may be performed between a first growth chamber I and a second growth chamber II, for example, between a first growth process and a second growth process. In a subsequent process of removing the silicon substrate 10, the silicon compound layer 12, such as silicon oxynitride, may interfere with the etching of the silicon substrate 10. Consequently, the silicon substrate 10 may be removed nonuniformly, thus causing a crack after the nitride single crystal is grown.

In an example embodiment, the process may be performed through a chemical etching process. In detail, in the chemical etching process, hydrofluoric acid buffered with ammonium fluoride ($NH_3F$), for example, a buffered oxide etch (BOE) solution, may be used.

In a manner different from the example embodiment, a process of removing the silicon compound layer 12 may be performed in variously modified forms thereof. The process may be performed through a grinding process or a patterning process, which may be performed in such a manner that the chemical etching process described above is combined therewith.

Figure 4:
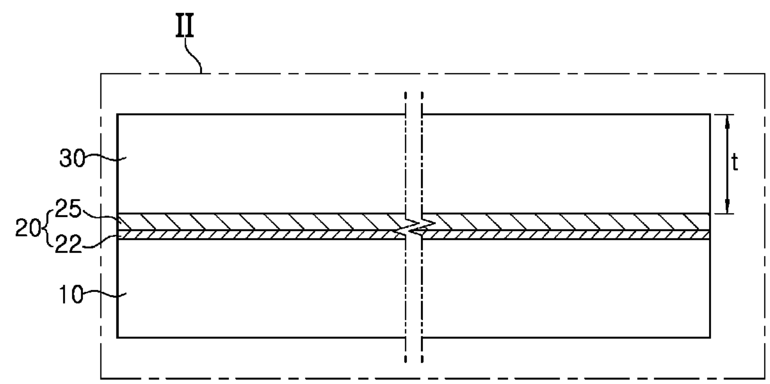

Subsequently, as illustrated in FIG. 4, a group III nitride single crystal 30 may be grown on the nitride template 20 using a second process environment different from the first process environment. For example, the second process environment may include a second growth chamber II and the group III nitride single crystal 30 may be grown on the nitride template 20 in the second growth chamber II.

The second growth chamber II may be provided as a chamber for HVPE growth. Using an HVPE process, the group III nitride single crystal 30 may be formed relatively rapidly to be thick enough to be used as a substrate. For example, a thickness t of the group III nitride single crystal 30 may be in a range of about 100 μm to about 2,000 μm. Since the group III nitride single crystal 30 is formed on the nitride template 20 that has been formed in advance, the group III nitride single crystal 30 may include a high quality crystal.

Figure 5:
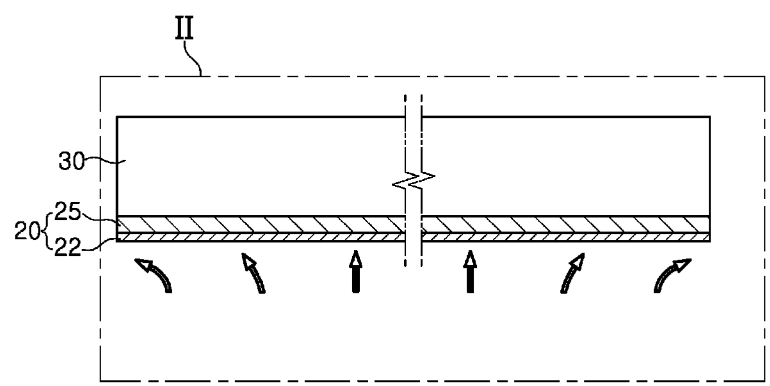

As illustrated in FIG. 5, the silicon substrate 10 may be removed from the second growth chamber II.

A process of removing the silicon substrate 10 may be performed in the second growth chamber II in which the group III nitride single crystal 30 is grown. Therefore, in a subsequent process, such as a cooling process, the crack caused by a difference in the thermal expansion coefficients between silicon and a nitride single crystal may be effectively prevented.

In the example embodiment, the group III nitride single crystal 30 may be grown, and the silicon substrate 10 may be removed. However, in a different example embodiment, the process of removing the silicon substrate 10 may also be performed while the group III nitride single crystal 30 is being grown. In detail, a portion of the group III nitride single crystal 30 may be grown, and the etching process of removing the silicon substrate 10 may be performed.

As such, a thickness of the silicon substrate 10 may be reduced while the group III nitride single crystal 30 is grown, thus relieving stress on the group III nitride single crystal 30.

Figure 6:
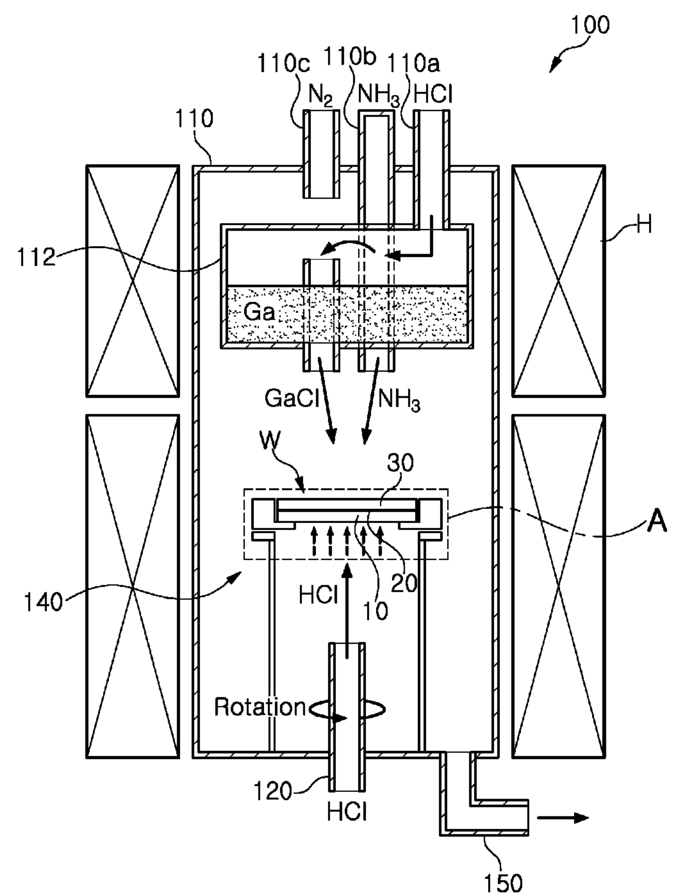
FIG. 6 is a cross-sectional view of a hydride vapor phase epitaxy (HVPE) device employable in a method of manufacturing a nitride semiconductor substrate according to an example embodiment.

The second growth chamber employed in the example embodiment may have a structure in which the group III nitride single crystal 30 is grown, and a process of removing a silicon substrate is performed, simultaneously. FIG. 6 is a cross-sectional view of an HVPE device employable in the example embodiment and performing a process of removing a substrate, simultaneously.

The HVPE device employed in the example embodiment is illustrated as having a vertical structure, but is not limited thereto. The HVPE device may also be applied to a horizontal structure in a manner similar to the vertical structure.

With reference to FIG. 6, an HVPE device 100, according to the example embodiment, may include a growth chamber 110, a susceptor 140 disposed in the growth chamber 110, and a heater H heating the growth chamber 110. The growth chamber 110 may include a first gas supply pipe 110*a*, a second gas supply pipe 110*b*, an etchant supply pipe 120, and a gas discharge pipe 150.

The first gas supply pipe 110*a* may provide a passage to supply a gallium source to the growth chamber 110. In a manner similar to the first gas supply pipe 110*a*, the second gas supply pipe 110*b* and a third gas supply pipe 110*c* may provide passages to supply an $NH_3$ gas and a dinitrogen ($N_2$) gas, respectively, to the growth chamber 110.

The first gas supply pipe 110*a* may be disposed to be connected to a receiving portion 112 including metal gallium (Ga) (e.g., gallium-115), to be oriented toward a wafer W. A hydrogen chloride (HCl) gas supplied through the first gas supply pipe 110*a* may react with gallium-115 to generate a gallium trichloride (GaCl) gas, so that the GaCl gas may be supplied to the growth chamber 110.

The heater H may increase a temperature within the growth chamber 110 in order for supplied gases to react with each other. In addition, $NH_3$ and GaCl may react, and thus a GaN single crystal may be grown on the wafer W disposed in the susceptor 140. The GaN single crystal may be grown, and residual gases may be discharged out of the growth chamber 110 through the gas discharge pipe 150.

The HVPE device 100 may be configured to etch and remove a silicon substrate when the wafer W in which a nitride single crystal is grown, is disposed in the chamber during or after a growth process of the nitride single crystal. A detailed description thereof will be provided with reference to FIGS. 7 and 8.

Figure 7:
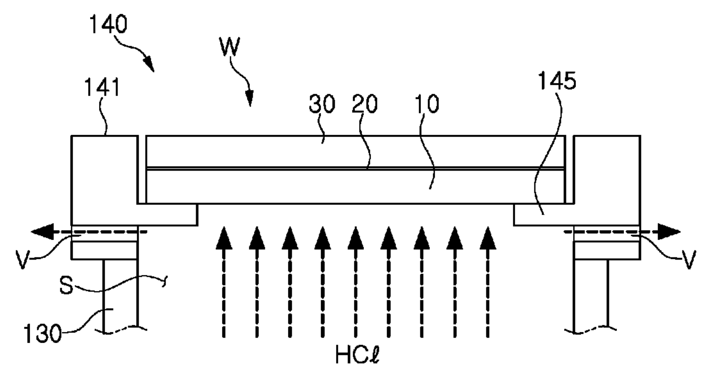
Figure 8:
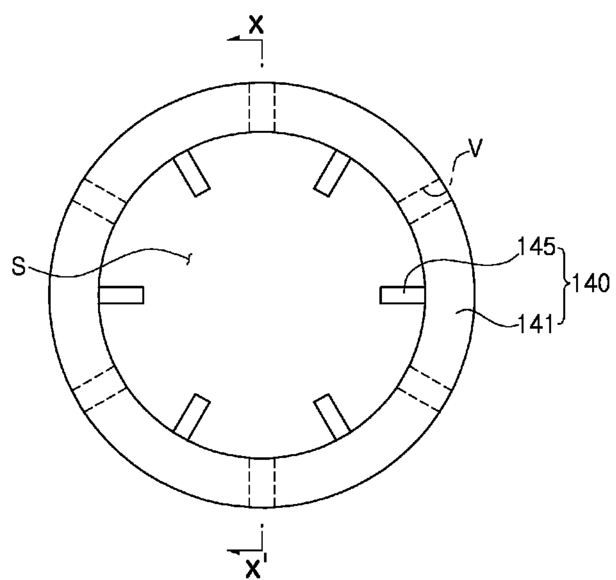
FIG. 8 is a plan view of the susceptor illustrated in FIG. 7.

FIG. 7 is an enlarged cross-sectional view of portion "A" (the susceptor 140) employed in the HVPE device illustrated in FIG. 6, while FIG. 8 is a plan view of a susceptor illustrated in FIG. 7. In this case, FIG. 7 may be construed as a cross section taken along line X-X' of the susceptor illustrated in FIG. 8.

As illustrated in FIG. 7, the susceptor 140 may include a main body 141 providing space including the wafer W mounted therein, and may include a plurality of stopping portions 145 disposed in the main body 141 to allow the wafer W to be mounted thereon.

In a lower portion of the susceptor 140, a support member 130 including an internal space S may be provided, while the etchant supply pipe 120 may be connected to the internal space S of the support member 130. The wafer W, mounted using the plurality of stopping portions 145, may allow a bottom surface of the silicon substrate 10 to be exposed toward the internal space S of the support member 130. An etching gas (e.g., HCl) may be introduced to the internal space S of the support member 130 through the etchant supply pipe 120, so that the silicon substrate 10 may be etched. An etching process described above may be performed during and/or after the growth process of a nitride single crystal 30 described above.

A by-product as well as the etching gas, may be discharged through an exhaust hole V disposed in the main body 141, and, finally, may be discharged outside through the gas discharge pipe 150 disposed in the growth chamber 110.

As such, the susceptor 140 employed in the example embodiment may have a structure in which the wafer W is mounted, and may be configured to etch a rear surface of the silicon substrate 10.

In an example embodiment, in order to form a different group III nitride single crystal, an additional boat including a different group III semiconductor material (e.g., Al and indium (In)), may be disposed, or one or more types of alloy may be disposed in the boat. In addition, a different nitride single crystal (e.g., AlGaN and aluminum gallium indium nitride (AlGaInN)) besides GaN may be grown.

Figure 9:
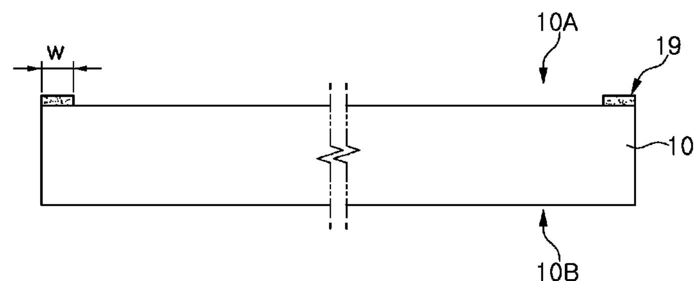
FIGS. 9 to 12 are process cross-sectional views illustrating a method of manufacturing a nitride semiconductor substrate according to an example embodiment.
Figure 11:
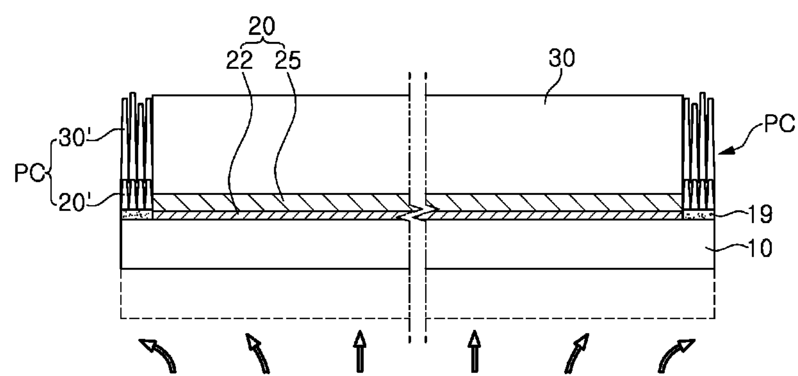
Figure 12:
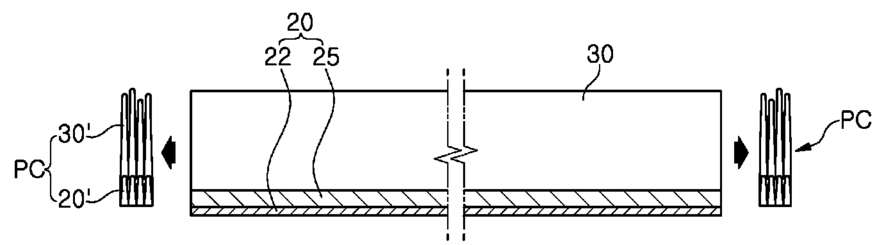
Figure 13:
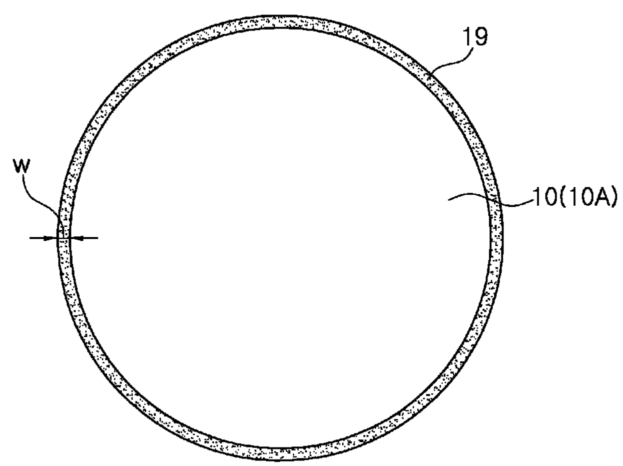
FIG. 13 is a plan view of a wafer illustrated in FIG. 9.

FIGS. 9 to 12 are process cross-sectional views illustrating a method of manufacturing a nitride semiconductor substrate according to an example embodiment, while FIG. 13 is a plan view of a silicon substrate 10, illustrated in FIG. 9.

As illustrated in FIGS. 9 and 13, an amorphous layer 19 may be formed on an edge of the silicon substrate 10, for example, along a circumference thereof. A width W of the amorphous layer 19 may be changed, depending on a size of the silicon substrate 10, but may be in a range of about 100 μm to about 2,000 μm. A thickness of the amorphous layer 19 may be in a range of about 10 nm to about 2,000 nm. In addition, the amorphous layer 19 may include silicon oxide, silicon nitride, or silicon oxynitride. The amorphous layer 19 may be formed using a sputtering process or a chemical vapor deposition (CVD) process in a process of forming the silicon substrate 10.

Figure 10:
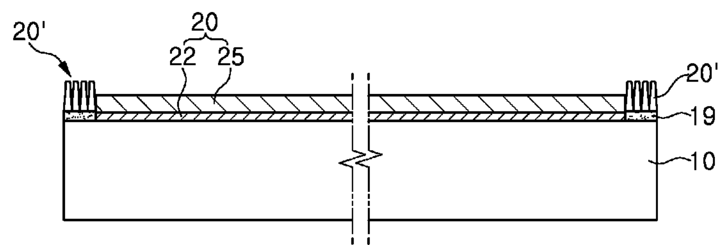

As illustrated in FIG. 10, a nitride template 20 may be formed on the silicon substrate 10 in a first growth chamber (e.g., an MOCVD chamber). A growth process described above may be understood with reference to a nitride template process described in FIG. 2, as long as another description thereof is not provided.

In a main region in which the amorphous layer 19 is not disposed in the silicon substrate 10, an Al-containing nitride layer 22 and a GaN stress relaxation layer 25 may be grown in sequence, thus forming a required nitride template 20. On the other hand, in a circumferential region in which the amorphous layer 19 is disposed, a flat epitaxial layer may not be grown, but a rough first polycrystalline nitride layer 20' may be formed.

As illustrated in FIG. 11, a group III nitride single crystal 30 may be formed on the nitride template 20 in a second growth chamber (e.g., an HVPE chamber). A growth process described above may be understood with reference to a nitride single crystal process described in FIG. 4, as long as another description thereof is not provided.

In the process, the group III nitride single crystal 30 may be formed on the nitride template 20, while a rough, second polycrystalline nitride layer 30', rather than the flat epitaxial layer, may be formed on the first polycrystalline nitride layer 20' disposed on the amorphous layer 19. The second polycrystalline nitride layer 30' and the first polycrystalline nitride layer 20' may configure a polycrystalline guide portion PC. The polycrystalline guide portion PC may prevent a crack from being generated on an edge of the group III nitride single crystal 30.

In the example embodiment, during a growth process of the group III nitride single crystal 30, a chemical etching process on a bottom surface of the silicon substrate 10 may be performed, and thus the silicon substrate 10 may be gradually removed. In FIG. 11, a dotted line represents a shape of the silicon substrate 10 before the chemical etching process is applied thereto.

As illustrated in FIG. 12, the silicon substrate 10 may be removed, and the polycrystalline guide portion PC may be removed from the group III nitride single crystal 30. A removal process described above may be simultaneously performed along with removal of the silicon substrate 10. For example, the silicon substrate 10 may be removed, and the polycrystalline guide portion PC may be simultaneously removed in a cooling process. Since the polycrystalline guide portion PC is provided as a polycrystal, the polycrystalline guide portion PC may be removed relatively completely along an interface of the group III nitride single crystal 30. According to need, the silicon substrate 10 may be removed, and the polycrystalline guide portion PC may be effectively removed by applying a slight amount of force thereto.

Figure 14:
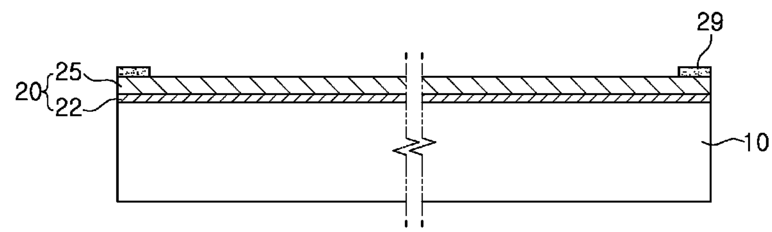
FIGS. 14 and 15 are process cross-sectional views illustrating a method of manufacturing a nitride semiconductor substrate according to an example embodiment.
Figure 15:
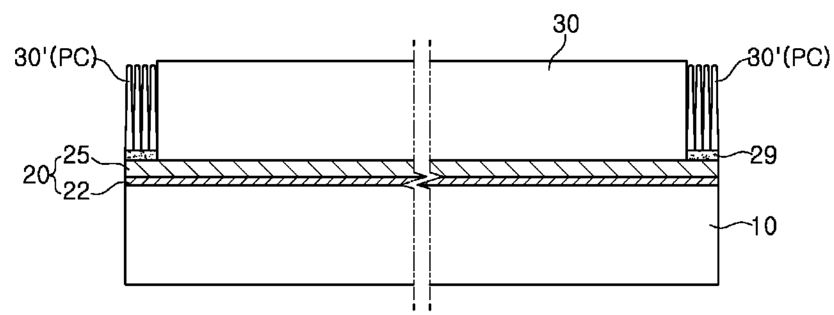

A polycrystalline guide portion using an amorphous layer may have various shapes. FIGS. 14 and 15 are process cross-sectional views illustrating a method of manufacturing a nitride semiconductor substrate using a guide portion having a different shape. In the example embodiment, an amorphous layer 29 may be employed after a nitride template 20 is formed, rather than in a process of forming a silicon substrate 10.

As illustrated in FIG. 14, the amorphous layer 29 may be formed along a circumference of the nitride template 20. The amorphous layer 29 may be formed to have a shape similar to that of an amorphous layer 19 illustrated in FIG. 13. In detail, a process described above may be performed after the nitride template 20 is formed in an MOCVD chamber, before being transferred to an HVPE chamber. The amorphous layer 29 may be formed using a process similar to that of an example embodiment described above. A process of forming the amorphous layer 29 may be performed before or after a process of removing a silicon compound layer 12 illustrated in FIG. 3.

As illustrated in FIG. 15, a group III nitride single crystal 30 may be formed on the nitride template 20 in a second growth chamber (e.g., an HVPE chamber). A growth process described above may be understood with reference to a nitride template process described in FIG. 4, as long as another description thereof is not provided.

The group III nitride single crystal 30 may be formed in a region of the nitride template 20 in which the amorphous layer 29 is not disposed, while a rough, second polycrystalline nitride layer 30', rather than a flat epitaxial layer, may be formed on the amorphous layer 29. In the example embodiment, the second polycrystalline nitride layer 30' may be provided as a polycrystalline guide portion PC. The polycrystalline guide portion PC may prevent a crack from being generated on an edge of the group III nitride single crystal 30.

In an example embodiment, as illustrated in FIG. 11, a chemical etching process on a bottom surface of the silicon substrate 10 may be performed to remove the silicon substrate 10 during a growth process of the group III nitride single crystal 30.

In a manner similar to an example embodiment described above, the silicon substrate 10 may be removed, and the polycrystalline guide portion PC may be removed from the group III nitride single crystal 30. A removal process described above may be spontaneously performed along with removal of the silicon substrate 10.

Figure 16:
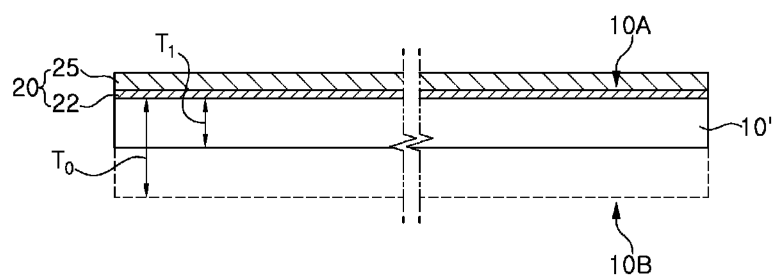
FIGS. 16 and 17 are cross-sectional views of a silicon substrate illustrating various examples in which a silicon compound layer is removed.
Figure 17:
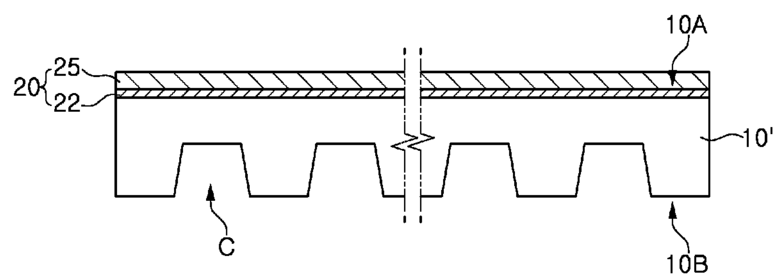

A process of removing the silicon compound layer 12 disposed on a second surface 10B of the silicon substrate 10, in a process of growing the nitride template 20, may be variously performed. FIGS. 16 and 17 are cross-sectional views of a silicon substrate, illustrating various examples in which a silicon compound layer is removed.

As illustrated in FIG. 16, a thickness of a silicon substrate 10' may be reduced from $T_0$ to $T_1$ using a grinding process on a second surface 10B of the silicon substrate 10'. Through the grinding process, the thickness thereof may be reduced, and a silicon compound layer 12 may also be removed from the second surface 10B of the silicon substrate 10'. Since the silicon substrate 10' has a reduced thickness $T_1$, a process of removing a substrate (see FIG. 5), performed in a subsequent process, may be quickly performed.

As illustrated in FIG. 17, a surface area of the second surface 10B of a silicon substrate 10" may be increased, using a patterning process. As illustrated in the example embodiment, a repetitive concave portion C may be formed on the second surface 10B of the silicon substrate 10", thus not only reducing the thickness of a portion of the silicon substrate 10", but also increasing an entirety of the surface area thereof. The silicon substrate 10" formed through the patterning process may be more effectively etched in the subsequent process of removing the substrate.

The patterning process may be performed in such a manner that a chemical etching process is combined therewith. In detail, before or after an etching process for patterning, the chemical etching process using a BOE solution may be applied to the second surface 10B of the silicon substrate 10", thus removing a silicon compound layer ($SiO_xN_y$).

Various processes of removing a silicon compound layer may be performed between the time of forming a nitride template in a first growth chamber (e.g., an MOCVD chamber) and growing a group III nitride single crystal in a second growth chamber (e.g., an HVPE chamber). In the process, the silicon compound layer 12, with a composition such as silicon oxynitride, may be removed, thus guaranteeing an efficient process of etching the silicon substrate in the second growth chamber.

Figure 18:
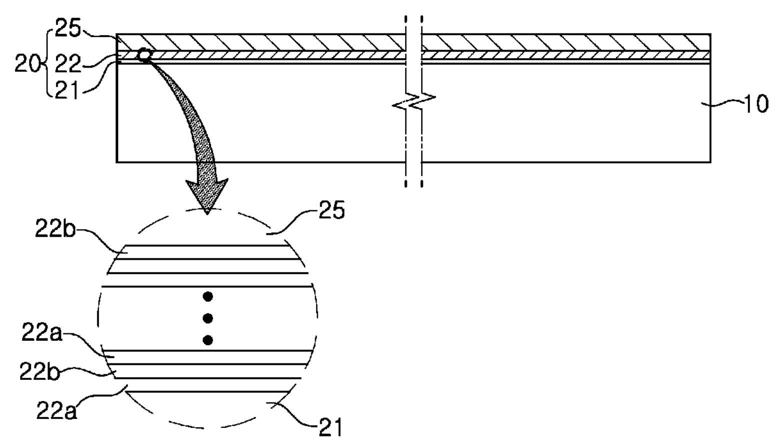
FIGS. 18 and 19 are cross-sectional views of the wafer, illustrating various examples of a nitride template employable in an example embodiment.
Figure 19:
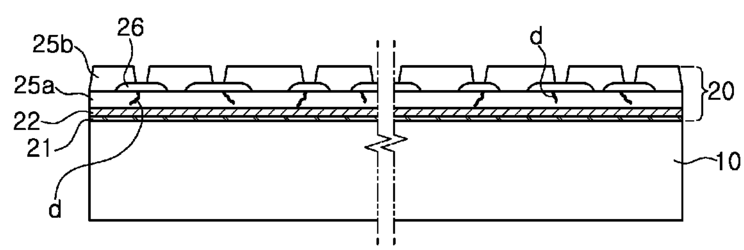

The nitride template employable in the example embodiments may have various structures. FIGS. 18 and 19 are cross-sectional views of a wafer, illustrating various examples of a nitride template employable in an example embodiment.

As illustrated in FIG. 18, a nitride template 20 employed in the example embodiment may further include an AlN nucleation layer 21 formed on a silicon substrate 10, as well as an Al-containing nitride layer 22 and a GaN stress relaxation layer 25.

The AlN nucleation layer 21 may be formed on a (111) plane of the silicon substrate 10, thus providing a growth surface having improved wettability. The AlN nucleation layer 21 may prevent a melt-back phenomenon, which phenomenon may allow eutectic metal to be formed in such a manner that silicon will react with gallium of a nitride single crystal. The AlN nucleation layer 21 may begin to be formed through a process of injecting an Al source, such as trimethylaluminum. The process of injecting the Al source first may prevent the silicon substrate 10 from being nitrided, by first being exposed to ammonia. In detail, the AlN nucleation layer 21 may have a size in a range of tens of nanometers to hundreds of nanometers.

As illustrated in FIG. 18, the Al-containing nitride layer 22 may include an AlN layer 22*a* and an AlGaN layer 22*b*, alternately stacked a plurality of times. On an interface between the Al-containing nitride layer 22 and a nitride crystal that may be grown in a subsequent process, a dislocation loop may be formed, thus reducing dislocation density. The Al-containing nitride layer 22 may reduce a lattice mismatch and a difference in thermal expansion coefficients between the AlN nucleation layer 21 and the GaN stress relaxation layer 25, thus effectively generating compressive stress during the growth of a crystal and reducing tensile stress generated during a cooling process.

In a manner different from the example embodiment, the Al-containing nitride layer 22 may be provided as nitride, comprising $Al_{x1}In_{y1}Ga_{1-x2-y2}N/Al_{x2}In_{y2}Ga_{1-x2-y2}N$ ($0 \le x1, x2, y1, y2 \le 1$, $x1 \ne x2$, or $y1 \ne y2$, $x1+y1 \le 1$, $x2+y2 \le 1$), or graded nitride, comprising $Al_xIn_yGa_{1-x-y}N$ ($0 \le x, y \le 1$, $x+y \le 1$). In detail, an Al-containing nitride layer 22 having a graded structure may be provided as AlGaN. A lattice constant of AlGaN may be gradually increased in such a manner that an Al component is reduced in sequence or in a stepwise manner.

The Al-containing nitride layer 22 or the AlN nucleation layer 21 may be used as an etch stop layer in a case in which the silicon substrate 10 is removed using an etching gas, such as HCl.

In one example embodiment, the GaN stress relaxation layer 25 may have a flat surface through two-dimensional growth.

As illustrated in FIG. 19, the nitride template 20 may include the AlN nucleation layer 21 disposed on a first surface of the silicon substrate 10, the Al-containing nitride layer 22 disposed on the AlN nucleation layer 21, and the GaN stress relaxation layer 25 disposed on the Al-containing nitride layer 22.

The GaN stress relaxation layer 25 may include a first GaN layer 25*a* disposed on the Al-containing nitride layer 22, a mask pattern 26 disposed on the first GaN layer 25*a*, and a second GaN layer 25*b* disposed on the first GaN layer 25*a* including the mask pattern 25 formed thereon.

The second GaN layer 25*b* may have a surface having a three-dimensional structure to reduce dislocation density during growth of the nitride single crystal (e.g., during an HVPE process). In detail, the second GaN layer 25*b* may be formed through GaN regrowth after the mask pattern 26 is formed on the first GaN layer 25*a* through in-situ treatment of silane ($SiH_4$). In one example embodiment, the mask pattern 26, provided through the in-situ treatment of $SiH_4$, may be formed in such a manner that $SiH_4$ and $NH_3$ flow is introduced to the first GaN layer 25*a* along with a carrier gas (e.g., $N_2$ or hydrogen ($H_2$)) at a high temperature. The in-situ treatment of $SiH_4$ may be performed at a temperature between about 500° C. and about 1200° C. The mask pattern 26 formed through a process described above may be provided as silicon nitride generated through a reaction between $SiH_4$ and $NH_3$. A threading dislocation region of the first GaN layer 25*a* may be etched at first through the in-situ treatment of $SiH_4$, thus reducing dislocation density. In a different example embodiment, the second GaN layer 25*b* may be formed to have the three-dimensional structure using a chemical etching process. In the chemical etching process, sulfuric acid ($H_2SO_4$) and hydrogen peroxide ($H_2O_2$), phosphoric acid ($H_3PO_4$) and/or potassium hydroxide (KOH) may be used.

Through an etching function described above, the crystal quality of the nitride single crystal grown in a subsequent HVPE process may be improved.

Figure 20:
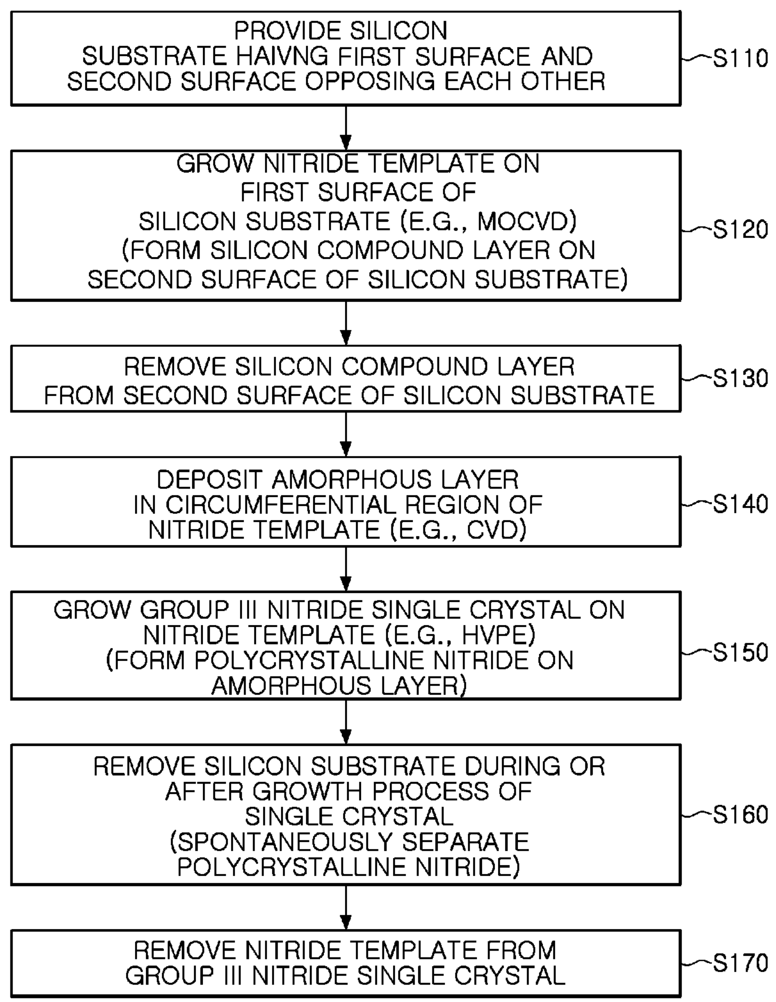
FIG. 20 is a flow chart illustrating a method of manufacturing a nitride semiconductor substrate according to an example embodiment of the present inventive concept.

Various example embodiments described above may be combined to be used as a method of manufacturing a series of nitride semiconductor substrates as long as no description to the contrary is provided. FIG. 20 is a process flowchart illustrating a method of manufacturing a nitride semiconductor substrate according to an example embodiment of the present inventive concept.

With reference to FIG. 20, a silicon substrate having a first surface and a second surface opposing each other is provided in S110 (see FIG. 1).

Subsequently, a nitride template may be grown on the first surface of the silicon substrate in S120 (see FIG. 2). The nitride template may be grown using an MOCVD process. In the process, a silicon compound layer, such as silicon oxynitride, may be formed on the second surface of the silicon substrate.

Subsequently, the silicon compound layer may be removed from the second surface of the silicon substrate in S130 (see FIG. 3). The silicon compound layer may be removed through a chemical etching process using a BOE solution. The silicon compound layer may be removed in such a manner that a grinding process (see FIG. 16) is combined with the chemical etching process or a patterning process (see FIG. 17) is combined with the chemical etching process, besides using the chemical etching process.

Subsequently, an amorphous layer may be deposited along a circumference of a nitride template in S140. In detail, the amorphous layer may be formed using a CVD process and a sputtering process. Subsequently, a group III nitride single crystal may be grown on the nitride template in S150 (see FIG. 4). In detail, the group III nitride single crystal may be formed using an HVPE process in a growth process described above. In the growth process of the group III nitride single crystal, a polycrystalline nitride may be formed on the amorphous layer. Details of processes described above may be understood with reference to a process described with reference to FIGS. 14 and 15.

A process using the amorphous layer may be performed in a manner similar to a process described with reference to FIGS. 10 to 13, rather than a process according to the example embodiment mentioned above with reference to FIGS. 14 and 15.

Subsequently, the silicon substrate may be removed during or after the growth process of the group III nitride single crystal in S160 (see FIG. 5). In a chamber for growing the group III nitride single crystal, the silicon substrate may be removed through an etching process using HCl. In a process of removing the silicon substrate described above, the polycrystalline nitride may be spontaneously separated or may be completely removed by applying a slight amount of force thereto.

Subsequently, according to need, the nitride template may be removed from the group III nitride single crystal in S170. Only a portion of a high quality nitride single crystal may remain, in such a manner that the grinding process is applied to a surface of the nitride template.

As set forth above, according to example embodiments of the present inventive concept, a high quality nitride semiconductor substrate may be effectively manufactured. In an example embodiment, after a first process of forming a nitride template, a process of removing a silicon compound layer from a surface (in detail, a rear surface) of a silicon substrate may be introduced, and a target group III nitride semiconductor layer may be grown on the nitride template. Therefore, the silicon substrate may be effectively removed in a second growth process, thus effectively preventing a crack caused by a difference in thermal expansion coefficients, and the like, from being generated.

In addition, as set forth above, according to an example embodiment, a method of manufacturing a nitride semiconductor substrate may include providing a silicon substrate having a first surface and a second surface, opposing each other; growing a nitride template on the first surface of the silicon substrate under a first process environment, in which a silicon compound layer is formed on the second surface of the silicon substrate during the growth of the nitride template; removing the silicon compound layer from the second surface of the silicon substrate; growing a group III nitride single crystal on the nitride template under a second process environment different from the first process environment; and removing the silicon substrate by applying an etching process to the second surface of the silicon substrate.

In addition, the nitride semiconductor substrate may be used as part of a semiconductor device. For example, in a method of manufacturing a semiconductor device according to certain embodiments, after providing a substrate in a process chamber and performing one or more of the nitride semiconductor substrate manufacturing processes described above using the first and second growth chambers above in connection with FIGS. 1-19, the substrate may be formed into a semiconductor device such as an integrated circuit on a die (e.g., by performing various fabrication processes and singulating the die from a wafer that forms the substrate). The integrated circuit may form a semiconductor device such as a semiconductor chip, and the semiconductor chip may be packaged into a semiconductor device such as a semiconductor package (e.g., having a single chip on a package substrate, or multiple chips on a package substrate) or a package-on-package device. Also, the substrate may be processed to form a plurality of package substrates that form part of semiconductor devices such as packages.

While example embodiments have been shown and described above, it will be apparent to those skilled in the art that modifications and variations could be made without departing from the scope of the appended claims.

What is claimed is:

1. A method of manufacturing a nitride semiconductor substrate, comprising:

providing a silicon substrate having a first surface and a second surface, opposing each other;

growing a nitride template on the first surface of the silicon substrate in a first growth chamber, in which a silicon compound layer is formed on the second surface of the silicon substrate during the growth of the nitride template and comprises at least one silicon nitride and silicon oxynitride;

removing the silicon compound layer from the second surface of the silicon substrate by using a first chemical etchant;

growing a group III nitride single crystal on the nitride template in a second growth chamber; and removing the silicon substrate from the second growth chamber by using a second chemical etchant different from the first etching etchant.

2. The method of claim 1, wherein the first growth chamber is provided as a chamber for metal-organic chemical vapor deposition (MOCVD) growth, or molecular beam epitaxy (MBE) growth, and the second growth chamber is provided as a chamber for hydride vapor phase epitaxy (HVPE) growth.

3. The method of claim 1, wherein the removing of the silicon substrate comprises applying an etching process to the second surface of the silicon substrate.

4. The method of claim 1, wherein the removing of the silicon substrate is performed during the growing of the group III nitride single crystal.

5. The method of claim 1, wherein the removing of the silicon substrate is performed after the growing of the group III nitride single crystal.

6. The method of claim 1, wherein the first etchant comprises hydrofluoric acid buffered with ammonium fluoride ($NH_3F$).

7. The method of claim 1, wherein the removing of the silicon compound layer comprises grinding the second surface of the silicon substrate to reduce a thickness of the silicon substrate.

8. The method of claim 1, wherein the removing of the silicon compound layer comprises patterning the second surface of the silicon substrate to increase a surface area of the second surface of the silicon substrate.

9. The method of claim 1, further comprising forming an amorphous layer in a circumferential region of the silicon substrate before the growing of the nitride template, wherein a polycrystalline nitride layer is grown on the amorphous layer in the growing of the nitride template and the growing of the group III nitride single crystal.

10. The method of claim 9, further comprising forming the amorphous layer in a circumferential region of the nitride template before the growing of the group III nitride single crystal, wherein the polycrystalline nitride layer is grown in the circumferential region of the nitride template in the growing of the group III nitride single crystal.

11. A method of manufacturing a nitride semiconductor substrate, comprising:

providing a silicon substrate having a first surface and a second surface, opposing each other;

growing a nitride template including an Al-containing nitride layer on the first surface of the silicon substrate in a first growth chamber;

removing a silicon compound layer formed on the second surface of the silicon substrate during the growth of the nitride template;

growing a group III nitride single crystal on the nitride template in a second growth chamber after removing the silicon compound layer from the second surface of the silicon substrate; and removing the silicon substrate to the Al-containing nitride layer using an etching process in the second growth chamber, wherein the removing of the silicon substrate is performed during the growing of the group III nitride single crystal.

12. The method of claim 11, wherein the Al-containing nitride layer has a structure in which an aluminum nitride (AlN) layer and an aluminum gallium nitride (AlGaN) layer are alternately stacked at least once.

13. The method of claim 11, wherein the growing of the nitride template comprises forming an AlN nucleation layer on the first surface of the silicon substrate, forming the Al-containing nitride layer on the AlN nucleation layer, and forming a GaN stress relaxation layer on the Al-containing nitride layer.

14. The method of claim 13, wherein the forming of the GaN stress relaxation layer comprises forming a first GaN layer on the Al-containing nitride layer, forming a mask pattern including silicon nitride on the first GaN layer, and forming a second GaN layer on the first GaN layer including the mask pattern disposed on the first GaN layer.

15. The method of claim 14, wherein the forming of the mask pattern comprises supplying a silane ($SiH_4$) gas along with a nitrogen source gas.

16. A method of manufacturing a nitride semiconductor substrate, comprising:

providing a silicon substrate having a first surface and a second surface, opposing each other;

growing a nitride template on the first surface of the silicon substrate in a first growth chamber, in which a silicon compound layer is formed on the second surface of the silicon substrate during the growth of the nitride template;

moving the silicon substrate from the first growth chamber to a second growth chamber, after the nitride template is grown on the first surface of the silicon substrate;

removing the silicon compound layer from the second surface of the silicon substrate before the step of moving the silicon substrate;

growing a group III nitride single crystal on the nitride template in the second growth chamber; and removing the silicon substrate in the second growth chamber by applying an etching process to the second surface of the silicon substrate.

17. The method of claim 16, wherein the first growth chamber is provided as a chamber for metal-organic chemical vapor deposition (MOCVD) growth, or a molecular beam epitaxy (MBE) growth, and the second growth chamber is provided as a chamber for hydride vapor phase epitaxy (HVPE) growth.

18. The method of claim 16, further comprising removing the nitride template from the group III nitride single crystal after removing the silicon substrate.

19. The method of claim 16, wherein the removing of the silicon compound layer comprises grinding the second surface of the silicon substrate to reduce a thickness of the silicon substrate.

20. The method of claim 16, wherein the removing of the silicon compound layer comprises patterning the second surface of the silicon substrate to increase a surface area of the second surface of the silicon substrate.

* * * * *